US008853715B2

(12) United States Patent
Matsuda

(10) Patent No.: US 8,853,715 B2
(45) Date of Patent: Oct. 7, 2014

(54) DISPLAY APPARATUS AND IMAGE PICKUP APPARATUS

(75) Inventor: Yojiro Matsuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/595,825

(22) Filed: Aug. 27, 2012

(65) Prior Publication Data

US 2013/0049017 A1 Feb. 28, 2013

(30) Foreign Application Priority Data

Aug. 31, 2011 (JP) .................. 2011-189134

(51) Int. Cl.
 *H01L 51/52* (2006.01)
 *H01L 51/44* (2006.01)
 *H01L 51/50* (2006.01)
 *H01L 51/00* (2006.01)

(52) U.S. Cl.
 CPC ............. *H01L 51/504* (2013.01); *H01L 51/006* (2013.01); *H01L 51/0085* (2013.01); *H01L 51/5004* (2013.01); *H01L 51/0054* (2013.01)
 USPC .............................. 257/89; 257/102; 257/103

(58) Field of Classification Search
 CPC ................. H01L 27/3209; H01L 27/3211
 USPC ............................................ 257/89, 102, 103
 See application file for complete search history.

(56) References Cited

U.S. PATENT DOCUMENTS 8,384,070 B2 * 2/2013 Kishino ................... 257/40
 2009/0296366 A1 * 12/2009 Shikina et al. ........... 362/19
 2012/0261653 A1 * 10/2012 Okamoto .................. 257/40

FOREIGN PATENT DOCUMENTS

| JP | 2007-066862 A | | 3/2007 |
| JP | 2007-234241 | * | 9/2007 |
| JP | 2007-234241 A | | 9/2007 |

* cited by examiner

*Primary Examiner* — Tom Thomas
*Assistant Examiner* — John Bodnar
(74) *Attorney, Agent, or Firm* — Canon U.S.A., Inc., IP Division

(57) ABSTRACT

A first light-emitting layer of a first organic electroluminescent element is disposed in common to a second organic electroluminescent element, a second light-emitting layer of the second organic electroluminescent element is disposed in contact with the first light-emitting layer and in the cathode side, and the second light-emitting layer is a light-emitting layer having an electron trapping property.

8 Claims, 4 Drawing Sheets

DISPLAY APPARATUS AND IMAGE PICKUP APPARATUS

BACKGROUND OF THE INVENTION

1. Field of the Invention

The present invention relates to a display apparatus provided with an organic electroluminescent element.

2. Description of the Related Art

The organic electroluminescent element has been developed actively in recent years and has a configuration in which an anode, an organic compound containing at least a light-emitting layer, and a cathode are stacked. Regarding a general method for manufacturing a multicolor display apparatus including organic electroluminescent elements of three colors, red, green, and blue, each of light-emitting layers of red, green, and blue is vacuum-evaporated by using a metal mask for patterning in accordance with the pixel shape of the color concerned.

The pixel size of the display apparatus has been reduced, and a high degree of accuracy has been required with respect to the metal mask for patterning in accordance with the pixel shape. As a result, production and maintenance of a metal mask with a high degree of accuracy have become difficult.

Japanese Patent Laid-Open No. 2007-066862 discloses a configuration in which a blue light-emitting layer is disposed all over a pixel region and a red light-emitting layer and a green light-emitting layer are disposed while being stacked as layers on the blue light-emitting layer. It is stated that the blue light-emitting layer is formed all over the pixel region without using a high-accuracy mask, so as to reduce the number of usage of the metal mask for patterning and, in addition, the life of the display apparatus can be improved by increasing a blue pixel area having a low luminous efficacy.

SUMMARY OF THE INVENTION

In the above-described configuration, regarding the red and the green organic electroluminescent elements, it is necessary that the blue light-emitting layer disposed all over the pixel region is not allowed to emit light, but only the red and the green light-emitting layers stacked are allowed to emit light. However, in some cases, electrons pass through the red light-emitting layer and the green light-emitting layer depending on the configurations of the red light-emitting layer and the green light-emitting layer, the electrons are leaked to the blue light-emitting layer, the blue light-emitting layer is allowed to emit light and, thereby, it becomes difficult to allow the red light-emitting layer and the green light-emitting layer to emit light efficiently.

Furthermore, Japanese Patent Laid-Open No. 2007-066862 discloses that electron block layers may be disposed between the red light-emitting layer and the blue light-emitting layer and between the green light-emitting layer and the blue light-emitting layer. However, regarding the configuration in which a charge block layer, e.g., the electron block layer, is disposed, the drive voltage of the element increases.

Aspects of the present invention provide a display apparatus including a light-emitting layer disposed in common to organic electroluminescent elements to emit different colors, wherein the individual organic electroluminescent elements are allowed to emit light efficiently without disposing a charge block layer between light-emitting layers.

A display apparatus according to aspects of the present invention includes a first organic electroluminescent element to emit a first color and a second organic electroluminescent element to emit a second color different from the above-described first color, the above-described organic electroluminescent element being provided with an anode, a cathode, and a light-emitting layer disposed between the above-described anode and the above-described cathode, wherein a first light-emitting layer of the above-described first organic electroluminescent element is disposed in common to the above-described second organic electroluminescent element, a second light-emitting layer of the above-described second organic electroluminescent element is disposed in contact with the above-described first light-emitting layer and in the side nearer to the above-described cathode than is the above-described first light-emitting layer, and the above-described second light-emitting layer contains a host material and a light-emitting dopant material and is configured to satisfy Relational expressions (A) and (B) described below, $$|LUMO_{D2}| > |LUMO_{H2}| \quad (A)$$

$$|LUMO_{D2}| - |LUMO_{H2}| > |HOMO_{H2}| - |HOMO_{D2}| \quad (B)$$

where $LUMO_{H2}$ and $HOMO_{H2}$ represent the LUMO level energy and the HOMO level energy, respectively, of the above-described host material contained in the above-described second light-emitting layer and $LUMO_{D2}$ and $HOMO_{D2}$ represent the LUMO level energy and the HOMO level energy, respectively, of the above-described light-emitting dopant material contained in the above-described second light-emitting layer.

According to aspects of the present invention, regarding a display apparatus including a light-emitting layer disposed in common to organic electroluminescent elements to emit different colors, the individual organic electroluminescent elements are allowed to emit light efficiently without disposing a charge block layer between light-emitting layers.

Further features of the present invention will become apparent from the following description of exemplary embodiments with reference to the attached drawings.

DESCRIPTION OF THE EMBODIMENTS

Figure 1A:
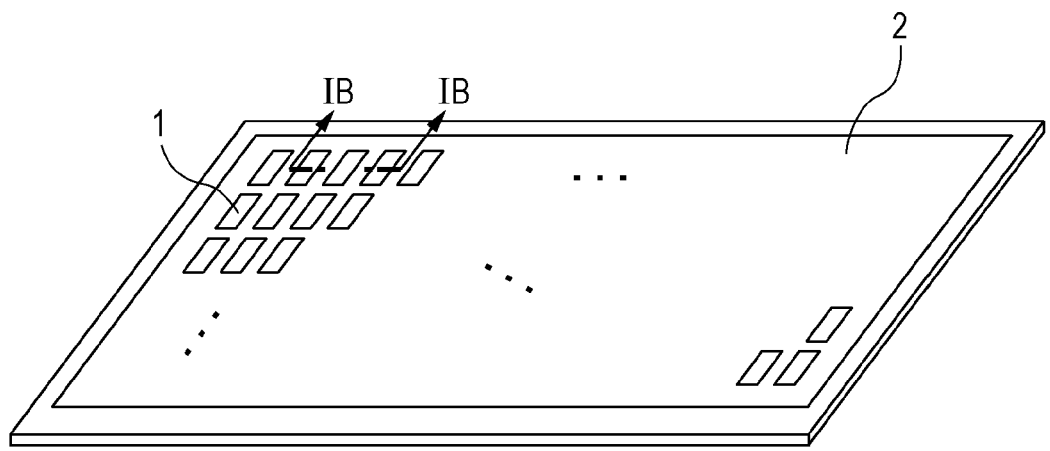
FIGS. 1A and 1B are schematic diagrams showing an example of a display apparatus according to a first embodiment.

A display apparatus according to aspects of the present invention will be described below on the basis of embodiments with reference to the drawings. Regarding the portions not specifically shown in the drawings or described in the present specification, well-known or publicly known technologies in the related art are applied. The embodiments explained below are no more than examples, and the present invention is not limited to them.

In particular, in the following embodiments, a first color, a second color, and a third color are specified to be green, red, and blue, respectively. A first organic electroluminescent element, a second organic electroluminescent element, and a third organic electroluminescent element are specified to be a green organic electroluminescent element, a red organic electroluminescent element, and a blue organic electroluminescent element. A first light-emitting layer, a second light-emitting layer, and a third light-emitting layer are specified to be a green light-emitting layer, a red light-emitting layer, and a blue light-emitting layer, respectively. However, the present invention is not limited to this configuration.

FIG. 1A is a schematic perspective diagram showing a display apparatus according to a first embodiment. The display apparatus according to the present embodiment includes a plurality of pixels 1 provided with an organic electroluminescent element. The plurality of pixels 1 are arranged in the matrix, so as to constitute a display region 2. In this regard, the pixel refers to a region corresponding to a light-emitting region of one light-emitting element. In the display apparatus according to the present embodiment, the light-emitting element is an organic electroluminescent element and one color of organic electroluminescent element is disposed in each pixel 1. Examples of colors emitted from the organic electroluminescent element include red, green, blue, yellow, cyan, magenta, and white. In the display apparatus according to the present embodiment, a plurality of pixel units formed from a plurality of pixels having different emission colors (for example, a pixel to emit red, a pixel to emit green, and a pixel to emit blue) are arranged. The pixel unit refers to a minimum unit which can emit a predetermined color through color mixing of the individual pixels.

Figure 1B:
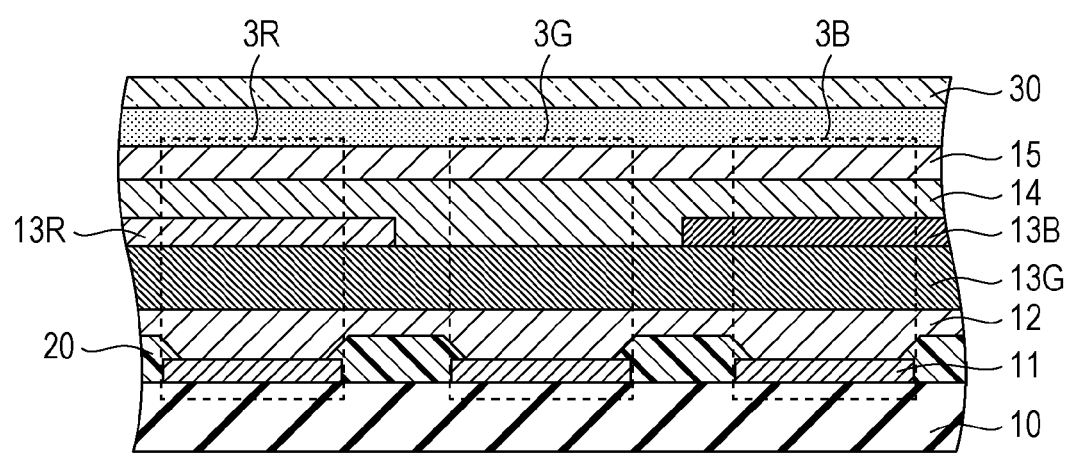

FIG. 1B is a schematic partial sectional diagram along a line IB-IB shown in FIG. 1A. The pixel 1 is formed from an organic electroluminescent element 3R (3G, 3B) provided with an anode 11, a hole transportation layer 12, a light-emitting layer 13R (13G, 13B) containing an organic compound, an electron transportation layer 14, and a cathode 15 on a substrate 10. The organic electroluminescent element 3R is an organic electroluminescent element to emit red and the red light-emitting layer 13R in the element emits light. Likewise, the organic electroluminescent elements 3G and 3B are an organic electroluminescent element to emit green and an organic electroluminescent element to emit blue, respectively, and the green light-emitting layer 13G and the blue light-emitting layer 13B, respectively, in the elements emit light.

The anode 11 is disposed separately from the anodes 11 of adjacent pixels, and an insulating layer 20 is disposed between pixels (more concretely, anodes 11) in order to prevent an occurrence of short-circuit with the cathode 15 due to a foreign substance. The hole transportation layer 12, the electron transportation layer 14, and the cathode 15 may be disposed in common to the adjacent pixels, as shown in FIG. 1B, or be disposed on a pixel basis through patterning.

The individual organic electroluminescent elements are sealed with a seal cap 30 in such a way that external oxygen and moisture do not enter. A desiccant is included in the inside of the seal cap 30.

In the present embodiment, the green light-emitting layer 13G of the green organic electroluminescent element 3G is integrally disposed over the regions of the organic electroluminescent elements 3R and 3B and, therefore, the green light-emitting layer 13G serves as a so-called common light-emitting layer. According to this configuration, the number of usage of a high-accuracy metal mask for patterning the light-emitting layer can be reduced.

Furthermore, in the red organic electroluminescent element 3R, the red light-emitting layer 13R is disposed while being stacked in contact with the green light-emitting layer 13G and in the cathode 15 side of the green light-emitting layer 13G. Likewise, in the blue organic electroluminescent element 3B, the blue light-emitting layer 13B is disposed while being stacked in contact with the green light-emitting layer 13G and in the cathode 15 side of the green light-emitting layer 13G. That is, in the configuration of the present embodiment, a charge block layer is not disposed between the red light-emitting layer 13R and the green light-emitting layer 13G serving as the common light-emitting layer nor between the blue light-emitting layer 13B and the green light-emitting layer 13G serving as the common light-emitting layer.

In order to allow the red organic electroluminescent element 3R and the blue organic electroluminescent element 3B to emit light efficiently even in the configuration in which a charge block layer is not disposed, the configurations of the red light-emitting layer 13R and the blue light-emitting layer 13B are devised. That is, in the present embodiment, the red light-emitting layer 13R contains a host material and a light-emitting dopant material and is configured to satisfy Relational expressions (1) and (2) described below, $$|LUMO_{D2}| > |LUMO_{H2}| \tag{1}$$

$$|LUMO_{D2}| - |LUMO_{H2}| > |HOMO_{H2}| - |HOMO_{D2}| \tag{2}$$

where $LUMO_{H2}$ and $HOMO_{H2}$ represent the lowest unoccupied molecular orbital (LUMO) level energy and the highest occupied molecular orbital (HOMO) level energy, respectively, of the host material contained in the red light-emitting layer 13R, and $LUMO_{D2}$ and $HOMO_{D2}$ represent the LUMO level energy and the HOMO level energy, respectively, of the light-emitting dopant material contained in the red light-emitting layer 13R.

Likewise, the blue light-emitting layer 13B contains a host material and a light-emitting dopant material and is configured to satisfy Relational expressions (3) and (4) described below, $$|LUMO_{D3}| > |LUMO_{H3}| \tag{3}$$

$$|LUMO_{D3}| - |LUMO_{H3}| > |HOMO_{H3}| - |HOMO_{D3}| \tag{4}$$

where $LUMO_{H3}$ and $HOMO_{H3}$ represent the LUMO level energy and the HOMO level energy, respectively, of the host material contained in the blue light-emitting layer 13B and $LUMO_{D3}$ and $HOMO_{D3}$ represent the LUMO level energy and the HOMO level energy, respectively, of the light-emitting dopant material contained in the blue light-emitting layer 13B.

Figure 2A:
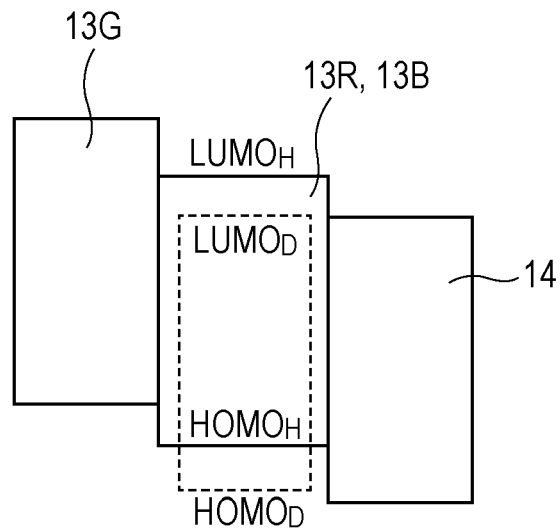
FIGS. 2A and 2B are schematic diagrams showing energy bands of light-emitting layers of a second organic electroluminescent element according to the first embodiment.
Figure 2B:
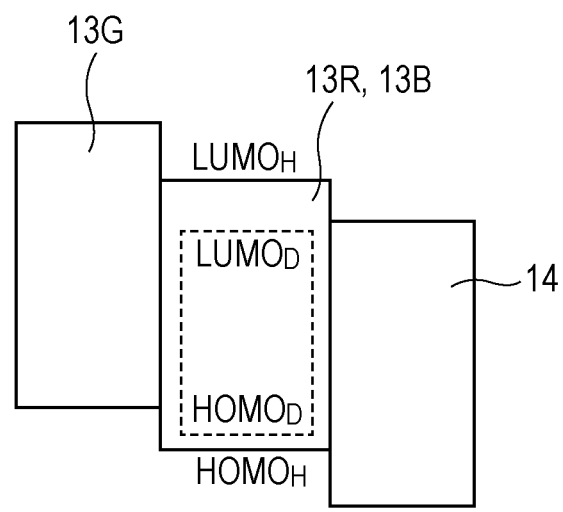

FIGS. 2A and 2B show energy bands of the red light-emitting layer 13R satisfying Relational expressions (1) and (2) or the blue light-emitting layer 13B satisfying Relational expressions (3) and (4). Hereafter and in FIGS. 2A and 2B, the term "$LUMO_D$" represents $LUMO_{D2}$ or $LUMO_{D3}$, although the subscript, "2" or "3", is omitted. The same goes for $HOMO_D$ and the like.

In FIG. 2A, the absolute value of the $LUMO_D$ of the light-emitting dopant material is larger than the absolute value of the $LUMO_H$ of the host material ($|LUMO_D| > |LUMO_H|$). Consequently, when electrons are injected from the electron transportation layer 14 into the light-emitting layers 13R and 13B, electrons are trapped at the LUMO level of the light-emitting dopant material and do not move in the light-emitting layers 13R and 13B easily to reach the green light-emitting layer 13G serving as the common light-emitting layer. Meanwhile, the absolute value of the $HOMO_D$ of the light-emitting dopant material is larger than the absolute value of the $HOMO_H$ of the host material ($|HOMO_D| > |HOMO_H|$). Consequently, when holes are injected from the green light-emitting layer 13G into the light-emitting layers 13R and 13B, holes are not trapped by the light-emitting dopant material and move in the light-emitting layers 13R and 13B. As a result, the light-emitting layers 13R and 13B have a so-called electron trapping property to move holes without moving electrons, and recombine electrons and holes efficiently in the light-emitting layers 13R and 13B, so that it becomes possible to use the recombination energy for emission of light.

In FIG. 2B, |LUMO$_D$|>|LUMO$_H$| holds as in FIG. 2A. However, the absolute value of the HOMO$_D$ of the light-emitting dopant material is smaller than the absolute value of the HOMO$_H$ of the host material (|HOMO$_D$|<|HOMO$_H$|). Consequently, when holes are injected from the green light-emitting layer 13G into the light-emitting layers 13R and 13B, holes are trapped at the HOMO level of the light-emitting dopant material easily. However, the energy difference |LUMO$_D$|−|LUMO$_H$| representing the strength of the electron trapping property is larger than the energy difference |HOMO$_H$|−|HOMO$_D$| representing the strength of the hole trapping property (|LUMO$_D$|−|LUMO$_H$|>|HOMO$_H$|−|HOMO$_D$|). As a result, the light-emitting layers 13R and 13B have the electron trapping property to suppress the movement of electrons, so that it becomes possible to recombine electrons and holes in the light-emitting layers 13R and 13B efficiently.

In particular, the configuration shown in FIG. 2A can be employed. In this case, the red light-emitting layer 13R satisfies Relational expression (5) described below and the blue light-emitting layer 13B satisfies Relational expression (6) described below.

$$|HOMO_{D2}|>|HOMO_{H2}|>|LUMO_{D2}|>|LUMO_{H2}| \qquad (5)$$

$$|HOMO_{D3}|>|HOMO_{H3}|>|LUMO_{D3}|>|LUMO_{H3}| \qquad (6)$$

In the case where the light-emitting layers 13R and 13B disposed in contact with the green light-emitting layer 13G serving as the common light-emitting layer and in the cathode 15 side satisfy Relational expressions described above, leakage of electrons to the common light-emitting layer is prevented and, thereby, the organic electroluminescent elements 3R and 3B are allowed to emit light efficiently. In this regard, in the red organic electroluminescent element 3R and the blue organic electroluminescent element 3B, the common light-emitting layer does not emit light in spite of being called a common light-emitting layer. That is, in the red organic electroluminescent element 3R, only the red light-emitting layer 13R emits light and in the blue organic electroluminescent element 3B, only the blue light-emitting layer 13B emits light. In aspects of the present invention, the term "do not emit light" refers to emit completely no light or emit light having intensity only at a level at which the intensity is not visually identified.

In the present embodiment, the green light-emitting layer 13G is mentioned as an example of the common light-emitting layer, although not specifically limited to this. As for the common light-emitting layer, another color light-emitting layer, e.g., a blue light-emitting layer 13B or a red light-emitting layer 13R, may also be applied. For example, in the case where the blue light-emitting layer 13B serves as a common light-emitting layer, the red light-emitting layer 13R may be configured to satisfy Relational expressions (1) and (2) described above, and the green light-emitting layer 13G may be configured to satisfy Relational expressions (3) and (4) described above.

In the configuration of the present embodiment, the anode 11, the hole transportation layer 12, the light-emitting layer, the electron transportation layer 14, and the cathode 15 are stacked in that order from the substrate 10 side. However, conversely, the cathode 15, the electron transportation layer 14, the light-emitting layer, the hole transportation layer 12, and the anode 11 may be stacked in that order from the substrate 10 side.

The display apparatus according to aspects of the present invention may be a bottom emission type display apparatus in which the light of the organic electroluminescent element is emitted from the substrate 10 side, or be a top emission type display apparatus in which the light of the organic electroluminescent element is emitted from the side opposite to the substrate 10.

Next, the individual members will be described concretely.

As for the substrate 10, for example, an insulating substrate made from glass, plastic, or the like and a silicon substrate may be used. In the substrate 10, switching elements, e.g., transistors and MIM elements, may be disposed on the above-described insulating substrate or the like. In that case, the substrate 10 may have a flattening film to flatten unevenness due to the switching elements.

As for the anode 11 and the cathode 15, for example, transparent oxide electrically conductive layers of tin oxide, indium oxide, indium tin oxide, indium zinc oxide, and the like and metal layers made from metal simple substances, e.g., Al, Ag, Cr, Ti, Mo, W, Au, Mg, and Cs, or alloys thereof may be used. Furthermore, the anode 11 and the cathode 15 may be formed from a stacked film of the transparent oxide electrically conductive layer and the metal layer or a stacked film of a plurality of metal layers.

The hole transportation layer 12 is formed from a single layer or a plurality of layers of an organic compound provided with a hole injection property and a hole transportation property. Meanwhile, the electron transportation layer 14 is formed from a single layer or a plurality of layers of an organic compound provided with an electron injection property and an electron transportation property. Optionally, in order to prevent movement of electrons from the light-emitting layer to the anode 11 side, an electron block layer may be disposed as the hole transportation layer 12. A hole block layer may be disposed as the electron transportation layer 14. An exciton block layer to suppress diffusion of excitons generated in the light-emitting layer may be disposed as the hole transportation layer 12 or the electron transportation layer 14. In this regard, the hole transportation layer 12 and the electron transportation layer 14 are not indispensable and may be omitted depending on the configuration of the organic electroluminescent element.

The material for the light-emitting layer is not specifically limited and a known material may be applied. The light-emitting dopant material may be either a fluorescent material or a phosphorescent material. The green light-emitting layer 13G serving as a common light-emitting layer may be formed from only a light-emitting material or be a mixed layer of a light-emitting dopant material and a host material. Furthermore, the light-emitting layer may contain an assist dopant material besides the host material and the light-emitting dopant material. In aspects of the present invention, the host material refers to a material having a largest content on a weight basis among the components in the light-emitting layer.

As for the insulating layer 20, resin materials, e.g., acrylic resins and polyimide resins, and inorganic materials, e.g., silicon nitride, may be used. Furthermore, a stacked film of the resin material and the inorganic material may also be used. The insulating layer 20 is not indispensable and may be omitted insofar as an occurrence of short-circuit between the anode 11 and the cathode 15 is prevented in the configuration.

As for the seal cap 30, a cap-shaped member of glass, plastic, or the like may be used. The seal cap 30 may be formed from, for example, a tabular member, e.g., a glass plate, and a sealing agent disposed around the display region 2 in order to bond the member and the substrate 10. A gas, e.g., nitrogen or argon, may be sealed into a space between the seal cap 30 and the cathode 15 of the organic electroluminescent element, or the space may be filled with a resin material, e.g., an acrylic resin.

Any configuration to seal the organic electroluminescent element may be employed. Regarding the configuration, in place of the seal cap 30, a seal film made from an inorganic material, e.g., silicon nitride, silicon oxide, or aluminum oxide, may be disposed on the cathode 15 of the organic electroluminescent element. The seal film may be formed from a stacked film of at least two layers of inorganic materials or be formed from a stacked film of an inorganic material and a resin material.

The display apparatus according to aspects of the present invention is used in display portions of television systems and personal computers. In addition, the display apparatus may be used in display portions and electronic viewfinders of image pickup apparatuses, e.g., digital cameras and digital video cameras. The image pickup apparatus further includes image pickup elements, e.g., an image pickup optical system and a CMOS sensor, to pick up an image.

The display apparatus according to the present embodiment may be used in a display portion of a cellular phone, a display portion of a hand-held video game machine, and the like and, furthermore, be used in a display portion of a portable music player, a display portion of a personal digital assistant (PDA), and a display portion of a car navigation system.

Figure 3:
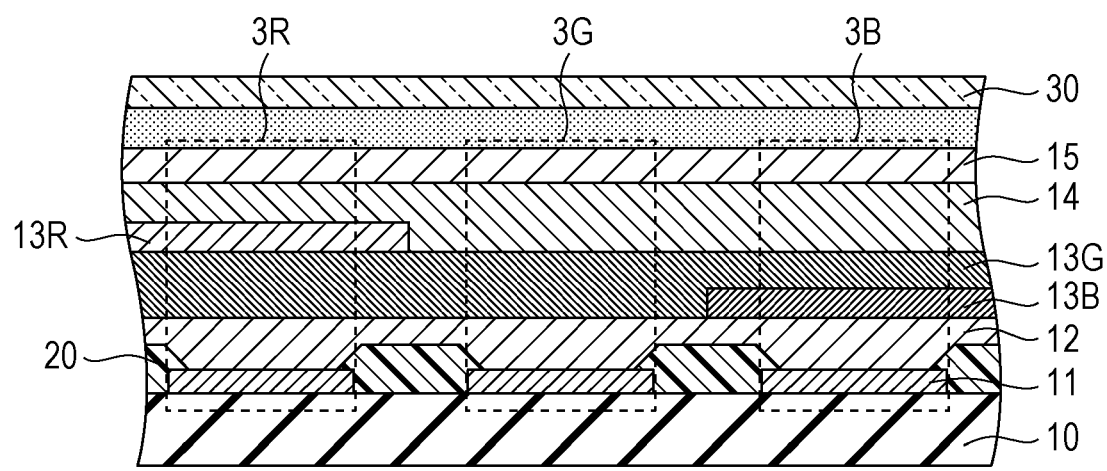
FIG. 3 is a schematic diagram showing an example of a display apparatus according to a second embodiment.

FIG. 3 is a schematic partial sectional diagram showing a second embodiment according to aspects of the present invention. The configuration of the present embodiment is the same as the configuration of the first embodiment except that the blue light-emitting layer 13B is disposed in contact with the green light-emitting layer 13G while being stacked in the anode 11 side and the configuration of the blue light-emitting layer 13B is different. In the red organic electroluminescent element 3R, only the red light-emitting layer 13R emits light and in the blue organic electroluminescent element 3B, only the blue light-emitting layer 13B emits light.

The blue light-emitting layer 13B contains a host material and a light-emitting dopant material and is configured to satisfy Relational expressions (7) and (8) described below, $$|HOMO_{D3}| < |HOMO_{H3}| \tag{7}$$

$$|HOMO_{H3}| - |HOMO_{D3}| > |LUMO_{D3}| - |LUMO_{H3}| \tag{8}$$

where $LUMO_{H3}$ and $HOMO_{H3}$ represent the LUMO level energy and the HOMO level energy, respectively, of the host material contained in the blue light-emitting layer 13B and $LUMO_{D3}$ and $HOMO_{D3}$ represent the LUMO level energy and the HOMO level energy, respectively, of the light-emitting dopant material contained in the blue light-emitting layer 13B.

Figure 4A:
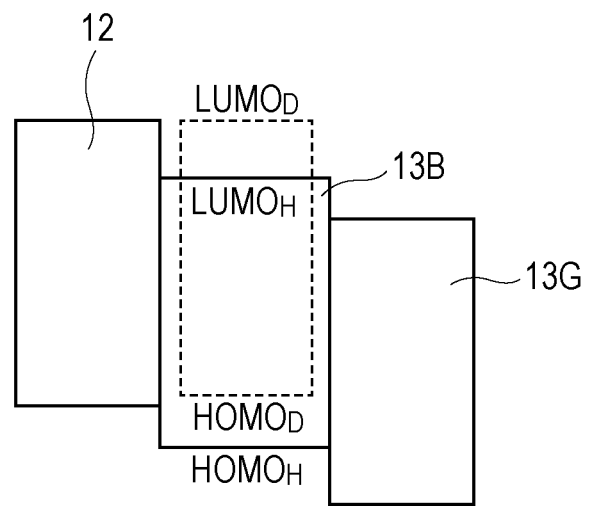
FIGS. 4A and 4B are schematic diagrams showing energy bands of light-emitting layers of a third organic electroluminescent element according to the second embodiment.
Figure 4B:
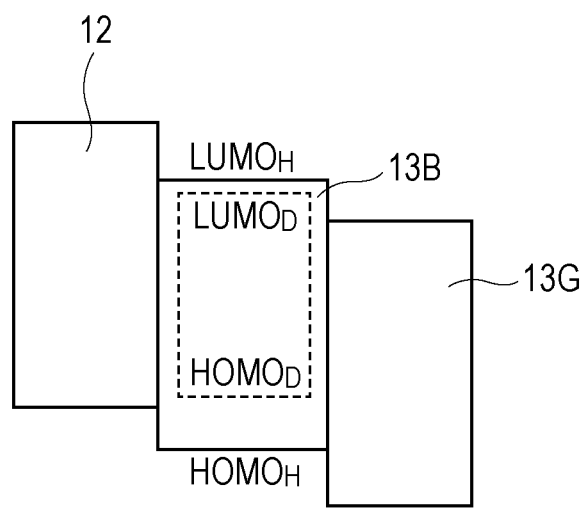

FIGS. 4A and 4B show energy bands of the blue light-emitting layer 13B satisfying Relational expressions (7) and (8). Hereafter and in FIGS. 4A and 4B, the term "$LUMO_D$" represents $LUMO_{D3}$, although the subscript "3" is omitted. The same goes for $HOMO_D$ and the like.

In FIG. 4A, the absolute value of the $HOMO_D$ of the light-emitting dopant material is smaller than the absolute value of the $HOMO_H$ of the host material ($|HOMO_D| < |HOMO_H|$). Consequently, when holes are injected from the hole transportation layer 12 into the blue light-emitting layer 13B, holes are trapped at the HOMO level of the light-emitting dopant material and do not move in the blue light-emitting layer 13B easily to reach the green light-emitting layer 13G serving as the common light-emitting layer. Meanwhile, the absolute value of the $LUMO_D$ of the light-emitting dopant material is smaller than the absolute value of the $LUMO_H$ of the host material ($|LUMO_D| < |LUMO_H|$). Consequently, when electrons are injected from the green light-emitting layer 13G into the blue light-emitting layer 13B, electrons are not trapped by the light-emitting dopant and move in the blue light-emitting layer 13B. As a result, the blue light-emitting layer 13B has a so-called hole trapping property to move electrons without moving holes, and recombine electrons and holes efficiently in the blue light-emitting layer 13B, so that it becomes possible to use the recombination energy for emission of light.

In FIG. 4B, $|HOMO_D| < |HOMO_H|$ holds as in FIG. 4A. However, the absolute value of $LUMO_D$ of the light-emitting dopant material is larger than the absolute value of $LUMO_H$ of the host material ($|LUMO_D| > |LUMO_H|$). Therefore, when electrons are injected from the green light-emitting layer 13G into the blue light-emitting layer 13B, electrons are trapped at the LUMO level of the light-emitting dopant material easily. However, the energy difference $|HOMO_H| - |HOMO_D|$ representing the strength of the hole trapping property is larger than the energy difference $|LUMO_D| - |LUMO_H|$ representing the strength of the electron trapping property ($|HOMO_H| - |HOMO_D| > |LUMO_D| - |LUMO_H|$). As a result, the blue light-emitting layer 13B has the hole trapping property to suppress the movement of holes, so that it becomes possible to recombine electrons and holes in the blue light-emitting layer 13B efficiently.

In particular, the configuration shown in FIG. 4A can be employed. In this case, the blue light-emitting layer 13B satisfies Relational expression (9) described below.

$$|LUMO_{D3}| < |LUMO_{H3}| < |HOMO_{D3}| < |HOMO_{H3}| \tag{9}$$

In the present embodiment, red light-emitting layer 13R is configured to satisfy Relational expression (1) and (2) as with the first embodiment.

Consequently, regarding the red organic electroluminescent element 3R, in the case where the red light-emitting layer 13R has an electron trapping property, leakage of electrons to the common light-emitting layer disposed in the anode 11 side of the red light-emitting layer 13R is prevented and, thereby, the red organic electroluminescent element 3R is allowed to emit light efficiently. Regarding the blue organic electroluminescent element 3B, in the case where the blue light-emitting layer 13B has a hole trapping property, leakage of holes to the common light-emitting layer disposed in the cathode 15 side of the blue light-emitting layer 13B is prevented and, thereby, the blue organic electroluminescent element 3B is allowed to emit light efficiently.

In the present embodiment, the green light-emitting layer 13G is mentioned as an example of the common light-emitting layer, although not specifically limited to this. As for the common light-emitting layer, another color light-emitting layer, e.g., a blue light-emitting layer 13B or a red light-emitting layer 13R, may also be applied. For example, in the case where the blue light-emitting layer 13B serves as a common light-emitting layer, the red light-emitting layer 13R may be configured to satisfy Relational expressions (1) and (2) described above, and the green light-emitting layer 13G may be configured to satisfy Relational expressions (7) and (8) described above.

In the above-described example, the red light-emitting layer 13R is disposed in the cathode 15 side of the common light-emitting layer and the blue light-emitting layer 13B is disposed in the anode 11 side of the common light-emitting layer. However, the red light-emitting layer 13R may be disposed in the anode 11 side of the common light-emitting layer and the blue light-emitting layer 13B may be disposed in the cathode 15 side of the common light-emitting layer. In this case, the red light-emitting layer 13R may satisfy Relational expressions (7) and (8) described above and the blue light-emitting layer 13B may satisfy Relational expressions (1) and (2) described above.

In the present embodiment, the anode 11, the hole transportation layer 12, the light-emitting layer, the electron transportation layer 14, and the cathode 15 are stacked in that order from the substrate 10 side. However, a reverse configuration may be employed.

The display apparatus according to aspects of the present invention may be a bottom emission type display apparatus in which the light of the organic electroluminescent element is emitted from the substrate 10 side, or be a top emission type display apparatus in which the light of the organic electroluminescent element is emitted from the side opposite to the substrate 10.

EXAMPLES

In the present example, the highest occupied molecular orbital (HOMO) level energy was measured by using photoelectron spectroscopy (AC-2 produced by RIKEN KIKI CO., LTD.). The lowest unoccupied molecular orbital (LUMO) level energy was calculated by subtracting the band gap, which was determined from an absorption edge of the absorption spectrum measured by using ultraviolet and visible spectroscopy (UV/VIS V-560 produced by JASCO Corporation), from the HOMO level energy.

Example 1

A display apparatus having the configuration shown in FIGS. 1A and 1B was produced. The present example corresponded to the first embodiment. The present example was a bottom emission type display apparatus in which the light was taken from the surface in the substrate 10 side.

A low-temperature polysilicon thin film transistor (TFT) was formed on a glass substrate, and an interlayer insulating film made from silicon nitride and a flattening film made from an acrylic resin were formed thereon, so that the substrate 10 shown in FIG. 1A was produced. An ITO film having a thickness of 100 nm was formed on the substrate 10 by a sputtering method. Subsequently, the ITO film was patterned on a pixel basis, so as to form an anode 11.

An acrylic resin was formed on the anode 11 through spin coating, and the acrylic resin was patterned through lithography, so as to form an insulating layer 20. Ultrasonic cleaning with isopropyl alcohol (IPA) was performed, and cleaning through boiling was performed, followed by drying. Furthermore, UV/ozone cleaning was performed and, thereafter, an organic compound layer described below was formed by a vacuum evaporation method under the following configuration.

Initially, Compound 1 having a thickness of 60 nm was evaporated all over the display region 2, so as to form a common hole transportation layer 12.

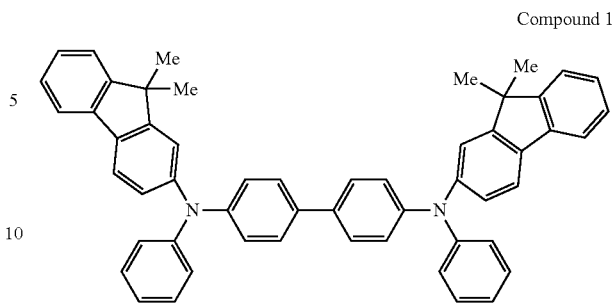
Compound 1

A host material represented by Compound 2 and a green light-emitting dopant material represented by Compound 3 were co-evaporated (volume ratio 98:2) on the hole transportation layer 12, so as to form the green light-emitting layer 13G having a film thickness of 20 nm all over the display region 2.

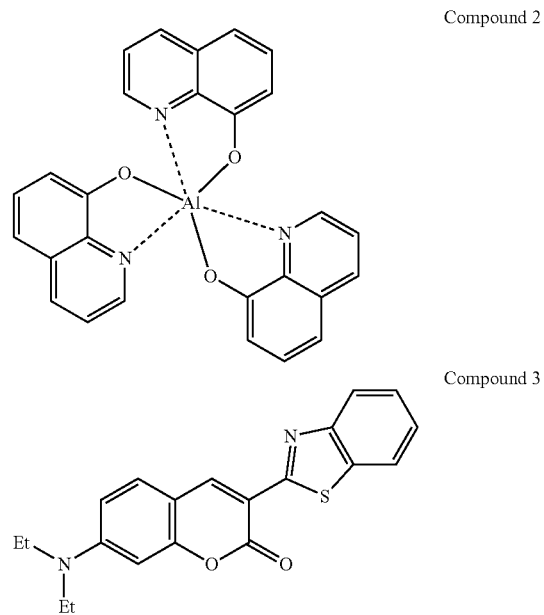
Compound 2

Compound 3

Subsequently, a host material represented by Compound 4 and a red light-emitting dopant material represented by Compound 5 were co-evaporated (volume ratio 99:1) at a position corresponding to the pixel of the red organic electroluminescent element 3R, so as to form the red light-emitting layer 13R having a film thickness of 20 nm by using a mask. Likewise, a host material represented by Compound 6 and a blue light-emitting dopant material represented by Compound 7 were co-evaporated (volume ratio 95:5) at a position corresponding to the pixel of the blue organic electroluminescent element 3B, so as to form the blue light-emitting layer 13B having a film thickness of 20 nm by using a mask.

The HOMO level energy and the LUMO level energy of the Compound 4 serving as a host material of the red light-emitting layer 13R were 5.50 eV and 2.96 eV, respectively. The HOMO level energy and the LUMO level energy of the Compound 5 serving as a red light-emitting dopant material of the red light-emitting layer 13R were 5.39 eV and 3.22 eV, respectively.

The HOMO level energy and the LUMO level energy of the Compound 6 serving as a host material of the blue light-emitting layer 13B were 5.68 eV and 2.74 eV, respectively. The HOMO level energy and the LUMO level energy of the Compound 7 serving as a blue light-emitting dopant material of the blue light-emitting layer 13B were 5.80 eV and 2.93 eV, respectively.

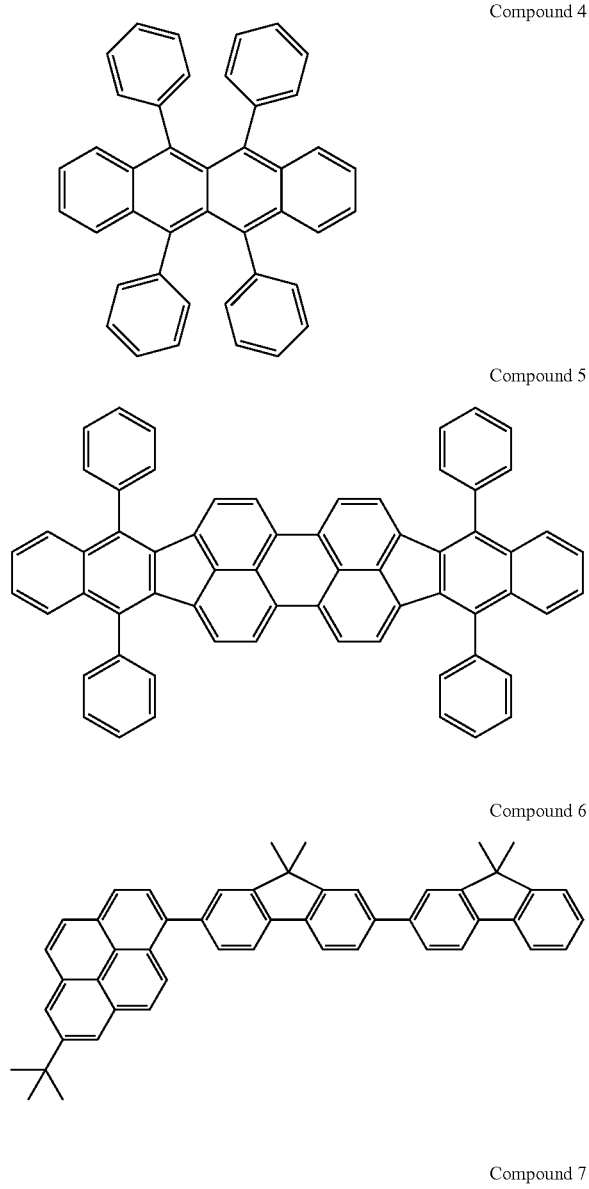

Compound 4

Compound 5

Compound 6

Compound 7

Compound 8 having a thickness of 10 nm was evaporated all over the display region 2, so as to form a common hole block layer (not shown in the drawing). Subsequently, Compound 9 having a thickness of 30 nm was evaporated all over the display region 2, so as to form a common electron transportation layer 14.

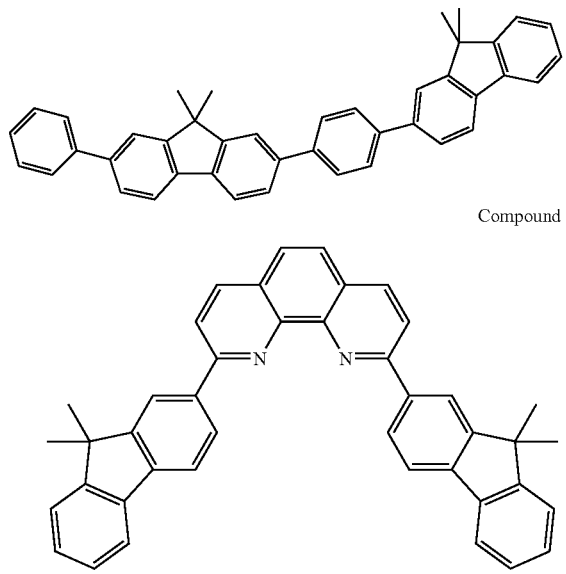

Compound 8

Compound 9

Then, a thin film of lithium fluoride (LiF) having a thickness of 0.5 nm was evaporated all over the display region 2, so as to form an electron injection layer (not shown in the drawing). Thereafter, an aluminum metal having a thickness of 100 nm was evaporated, so as to form a film of the cathode 15. Finally, the whole display region 2 was sealed with a seal cap 30 including a desiccant in a glove box in a nitrogen atmosphere.

The red light-emitting layer 13R and the blue light-emitting layer 13B were light-emitting layers satisfying Relational expressions (1) and (2) and Relational expressions (3) and (4), respectively, and having an electron trapping property.

The characteristics of the thus obtained display apparatus were evaluated. When a predetermined current was passed through each of the pixels, the red organic electroluminescent element 3R, the green organic electroluminescent element 3G, and the blue organic electroluminescent element 3B exhibited good light emission characteristics of red light emission, green light emission, and blue light emission, respectively.

Comparative Example 1

In the present comparative example, the same display apparatus as that in Example 1 except the configurations of the red light-emitting layer 13R and the blue light-emitting layer 13B was produced.

The red light-emitting layer 13R having a film thickness of 20 nm was formed through co-evaporation (volume ratio of 96:4) of the host material represented by Compound 10 and the red light-emitting dopant material represented by Compound 11. The blue light-emitting layer 13B having a film thickness of 20 nm was formed through co-evaporation (volume ratio of 95:5) of the host material represented by Compound 12 and the blue light-emitting dopant material represented by Compound 13.

The HOMO level energy and the LUMO level energy of the Compound 10 serving as a host material of the red light-emitting layer 13R were 5.77 eV and 2.77 eV, respectively. The HOMO level energy and the LUMO level energy of the Compound 11 serving as a red light-emitting dopant material of the red light-emitting layer 13R were 5.16 eV and 2.96 eV, respectively.

The HOMO level energy and the LUMO level energy of the Compound 12 serving as a host material of the blue light-emitting layer 13B were 5.72 eV and 2.77 eV, respectively. The HOMO level energy and the LUMO level energy of the Compound 13 serving as a blue light-emitting dopant material of the blue light-emitting layer 13B were 5.36 eV and 2.49 eV, respectively.

13B to the common light-emitting layer is not prevented and, thereby, electrons and holes are not recombined efficiently in the red light-emitting layer 13R and the blue light-emitting layer 13B.

Example 2

A display apparatus provided with the organic electroluminescent element having the configuration shown in FIG. 3 was produced. The present example corresponded to the sec-

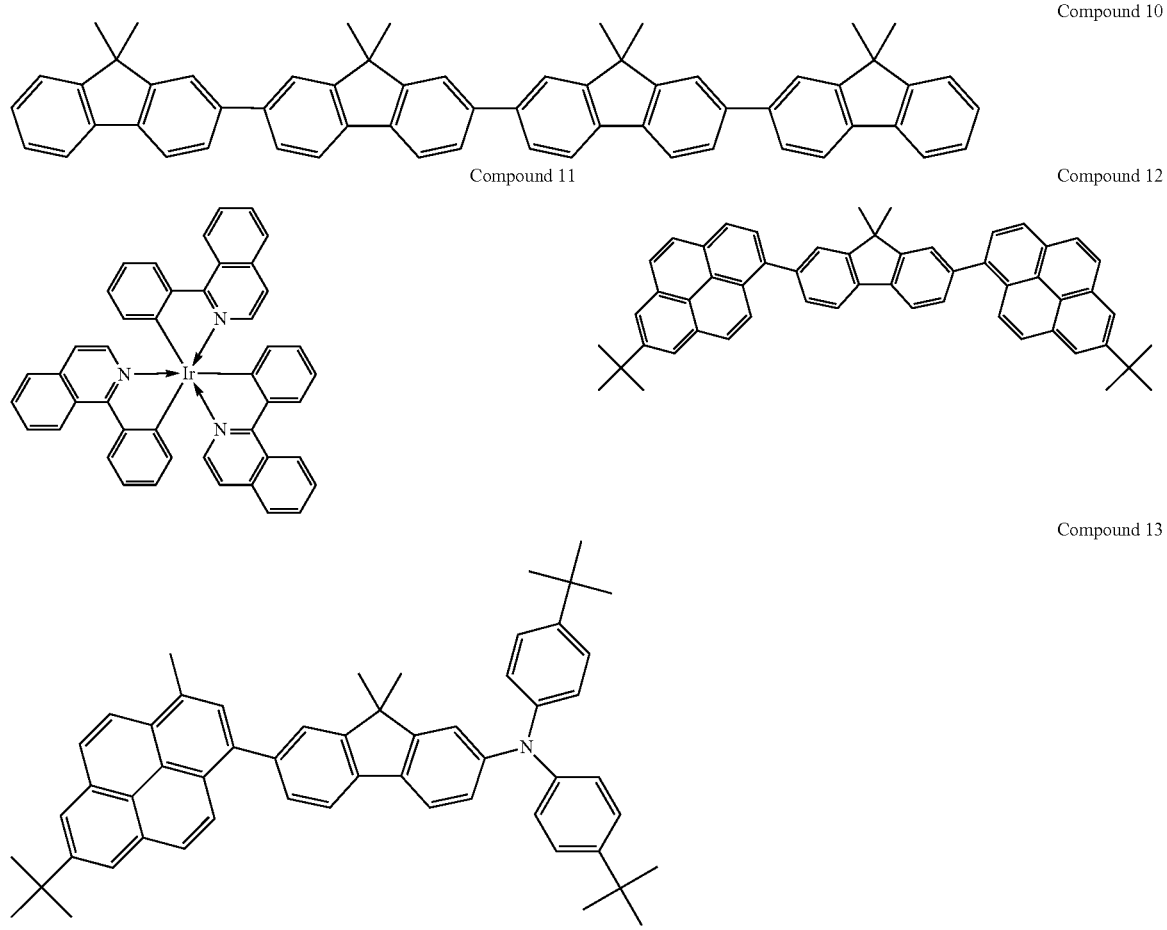

The characteristics of the thus obtained display apparatus were evaluated. When a predetermined current was passed through each of the pixels, the green organic electroluminescent element 3G exhibited good light emission characteristics of green light emission. However, regarding the red organic electroluminescent element 3R and the blue organic electroluminescent element 3B, insufficient light emission characteristics were exhibited where a monochromatic red light emission characteristic and a monochromatic blue light emission characteristic were not obtained, but a green light emission component was mixed in each characteristic.

The reason for this is believed to be that each of the red light-emitting layer 13R and the blue light-emitting layer 13B is a light-emitting layer configured to have a hole trapping property satisfying the relationship, $|HOMO_D|<|HOMO_H|$ and, in addition, $|HOMO_H|-|HOMO_D|>|LUMO_D|-|LUMO_H|$. That is, it is believed that leakage of electrons from the red light-emitting layer 13R and the blue light-emitting layer ond embodiment. The present example was a top emission type organic electroluminescent element in which the light was taken from the surface opposite to the substrate 10.

The present example is different from Example 1 in the configurations of the anode 11 and the cathode 15, the configuration and the formation order of the blue light-emitting layer 13B, and the configuration of the electron injection layer. Only portions different from Example 1 will be described below.

The anode 11 was formed from an aluminum alloy and an ITO film. Concretely, in the formation, a film of aluminum alloy having a thickness of 200 nm was formed as a reflection electrode, an ITO film having a thickness of 20 nm was formed, and the aluminum alloy and the ITO film were patterned on a pixel basis.

In the present example, the blue light-emitting layer 13B was formed in the anode 11 side while being in contact with the green light-emitting layer 13G. Concretely, in the step to form the organic compound layer in Example 1, the hole transportation layer 12 was formed. Thereafter, the blue light-emitting layer 13B was formed before the green light-emitting layer 13G was formed. In this regard, the blue light-emitting layer 13B having a film thickness of 20 nm was formed through co-evaporation (volume ratio of 95:5) of the host material represented by Compound 12 described above and the blue light-emitting dopant material represented by Compound 13 described above.

The electron injection layer (not shown in the drawing) having a thickness of 60 nm was formed on the electron transportation layer 14 through co-evaporation of Compound 9 described above and cesium carbonate in such a way that the cesium concentration became 8.3 percent by weight.

Regarding the cathode 15, an IZO film having a thickness of 30 nm was formed on the electron injection layer by a sputtering method.

The red light-emitting layer 13R was a light-emitting layer satisfying Relational expressions (1) and (2) and having an electron trapping property. The blue light-emitting layer 13B was a light-emitting layer satisfying Relational expressions (7) and (8) and having a hole trapping property.

The characteristics of the thus obtained display apparatus were evaluated. When a predetermined current was passed through each of the pixels, the red organic electroluminescent element 3R, the green organic electroluminescent element 3G, and the blue organic electroluminescent element 3B exhibited good light emission characteristics of red light emission, green light emission, and blue light emission, respectively.

Comparative Example 2

In the present comparative example, the same display apparatus as that in Example 2 except the configuration of the blue light-emitting layer 13B was produced.

The blue light-emitting layer 13B having a film thickness of 20 nm was formed through co-evaporation (volume ratio of 95:5) of the host material represented by Compound 6 described above and the blue light-emitting dopant material represented by Compound 7 described above.

The characteristics of the thus obtained display apparatus were evaluated. When a predetermined current was passed through each of the pixels, the green organic electroluminescent element 3G and the red organic electroluminescent element 3R exhibited good light emission characteristics of green light emission and red light emission. However, regarding the blue organic electroluminescent element 3B, insufficient light emission characteristics were exhibited where a monochromatic blue light emission characteristic was not obtained, but a green light emission component was mixed in the characteristic.

The reason for this is believed to be that the blue light-emitting layer 13B is a light-emitting layer configured to have an electron trapping property satisfying the relationship, $|LUMO_D|>|LUMO_H|$ and, in addition, $|LUMO_D|-|LUMO_H|>|HOMO_H|-|HOMO_D|$. That is, it is believed that leakage of holes to the common light-emitting layer disposed as a layer on the blue light-emitting layer 13B is not prevented and, thereby, electrons and holes are not recombined efficiently in the blue light-emitting layer 13B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-189134 filed Aug. 31, 2011, which is hereby incorporated by reference herein in its entirety.

What is claimed is:
1. A display apparatus comprising:
a first organic electroluminescent element to emit a first color; and
a second organic electroluminescent element to emit a second color different from the first color,
a third organic electroluminescent element to emit a third color different from the first color and the second color,
both first, second and third organic electroluminescent elements being provided with an anode, a cathode, and a light-emitting layer disposed between the anode and the cathode,
wherein a first light-emitting layer of the first organic electroluminescent element is disposed in common to the second and the third organic electroluminescent elements,
a second light-emitting layer of the second organic electroluminescent element is disposed in contact with the first light-emitting layer and disposed between the cathode and the first light-emitting layer, and
the second light-emitting layer contains a host material and a light-emitting dopant material and is configured to satisfy Relational expressions (A) and (B) described below,

$$|LUMO_{D2}|>|LUMO_{H2}| \quad (A)$$

$$|LUMO_{D2}|-|LUMO_{H2}|>|HOMO_{H2}|-|HOMO_{D2}| \quad (B)$$

where $LUMO_{H2}$ and $HOMO_{H2}$ represent the LUMO level energy and the HOMO level energy, respectively, of the host material contained in the second light-emitting layer and $LUMO_{D2}$ and $HOMO_{D2}$ represent the LUMO level energy and the HOMO level energy, respectively, of the light-emitting dopant material contained in the second light-emitting layer,
a third light-emitting layer of the third organic electroluminescent element is disposed in contact with the first light-emitting layer and disposed between the anode and the first light-emitting layer, and
the third light-emitting layer contains a host material and a light-emitting dopant material and is configured to satisfy Relational expressions (E) and (F) described below, $$|HOMO_{D3}|<|HOMO_{H3}| \quad (E)$$

$$|HOMO_{H3}|-|HOMO_{D3}|>|LUMO_{D3}|-|LUMO_{H3}| \quad (F)$$

where $LUMO_{H3}$ and $HOMO_{H3}$ represent the LUMO level energy and the HOMO level energy, respectively, of the host material contained in the third light-emitting layer and $LUMO_{D3}$ and $HOMO_{D3}$ represent the LUMO level energy and the HOMO level energy, respectively, of the light-emitting dopant material contained in the third light-emitting layer.

2. The display apparatus according to claim 1, wherein in the second organic electroluminescent element, only the second light-emitting layer emits light.

3. The display apparatus according to claim 1, wherein the second light-emitting layer is configured to satisfy Relational expression (G) described below, $$|HOMO_{D2}|>|HOMO_{H2}|>|LUMO_{D2}|>|LUMO_{H2}| \quad (G).$$

4. The display apparatus according to claim 1, wherein the first light-emitting layer emits green light.

5. The display apparatus according to claim 1, wherein in the third organic electroluminescent element, only the third light-emitting layer emits light.

6. The display apparatus according to claim 1, wherein the third light-emitting layer is configured to satisfy Relational expression (I) described below, $$|LUMO_{D3}| < |LUMO_{H3}| < |HOMO_{D3}| < |HOMO_{H3}| \qquad (I).$$

7. The display apparatus according to claim 1, wherein the first light-emitting layer emits green light, the second light-emitting layer emits red light, and the third light-emitting layer emits blue light.

8. An image pickup apparatus comprising the display apparatus according to claim 1 and an image pickup element.

* * * * *